United States Patent [19]

Nakamura et al.

[11] Patent Number: 5,446,015

[45] Date of Patent: Aug. 29, 1995

[54] SUPERCONDUCTING DEVICE HAVING A REDUCED THICKNESS OF OXIDE SUPERCONDUCTING LAYER

[75] Inventors: Takao Nakamura; Hiroshi Inada; Michitomo Iiyama, all of Osaka, Japan

[73] Assignee: Sumitomo Electric Industries, Ltd., Japan

[21] Appl. No.: 194,631

[22] Filed: Feb. 10, 1994

Related U.S. Application Data

[63] Continuation of Ser. No. 761,047, Sep. 18, 1991, abandoned.

[30] Foreign Application Priority Data

Sep. 19, 1990 [JP] Japan ................... 2-249547
Sep. 28, 1990 [JP] Japan ................... 2-259159

[51] Int. Cl.⁶ .................. H01L 39/00; H01L 39/14
[52] U.S. Cl. ........................... 505/193; 505/234; 505/235; 505/239; 505/701; 257/39; 257/34; 257/38
[58] Field of Search ............... 505/1, 701–704, 505/193, 234, 235, 239; 428/688, 930; 257/38, 34, 39

[56] References Cited

U.S. PATENT DOCUMENTS

| | | | |
|---|---|---|---|
| 5,057,485 | 10/1991 | Nishino | 505/1 |
| 5,061,687 | 10/1991 | Takada | 505/1 |

FOREIGN PATENT DOCUMENTS

| | | | |
|---|---|---|---|
| 324044 | 7/1989 | European Pat. Off. | |
| 354804 | 2/1990 | European Pat. Off. | |
| 475838 | 3/1992 | European Pat. Off. | |
| 275144 | 11/1988 | Japan | |
| 64-66980 | 3/1989 | Japan | 257/39 |
| 1-170080 | 7/1989 | Japan | |
| 1-264263 | 10/1989 | Japan | 257/663 |
| 138780 | 5/1990 | Japan | |

OTHER PUBLICATIONS

Kleinsasser et al, "Three–Terminal Devices," in Superconducting Devices, Ruggier et al., eds., Academic Press, Boston: 1990. pp. 325–372 available on or before Jul. 24, 1990.

Wu, X. D., et al. "High Critical Currents in Epitaxial $YBa_2Cu_3O_{7-x}$ Thin Films on Silicon with Buffer Layers", Appl. Phys. Lett., vol. 54, No. 8, 20 Feb. 1989, pp. 754–756.

European Search Report and Annex.

D. F. Moore et al, "Superconducting Thin Films for Device Applications", Workshop on High Temperature Superconducting Electron Devices, pp. 281–184; (Jun. 7, 1989).

*Primary Examiner*—Sara W. Crane
*Assistant Examiner*—Alice W. Tang
*Attorney, Agent, or Firm*—Beveridge, DeGrandi, Weilacher & Young

[57] ABSTRACT

For manufacturing a superconducting device, a first oxide superconductor thin film having a very thin thickness is formed on a principal surface of a substrate, and a stacked structure of a gate insulator and a gate electrode is formed on a portion of the first oxide superconductor thin film. A second oxide superconductor thin film is grown on an exposed surface of the first oxide superconductor thin film, using the gate electrode as a mask, so that first and second superconducting regions having a relatively thick thickness are formed at opposite sides of the gate electrode, electrically isolated from the gate electrode. A source electrode and a drain electrode are formed on the first and second oxide superconducting regions. The superconducting device thus formed can function as a super-FET.

28 Claims, 3 Drawing Sheets

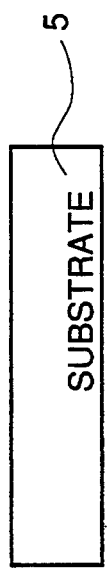
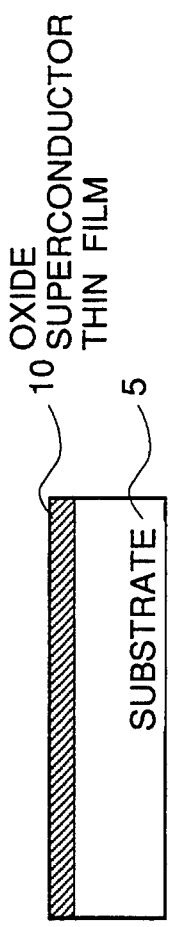
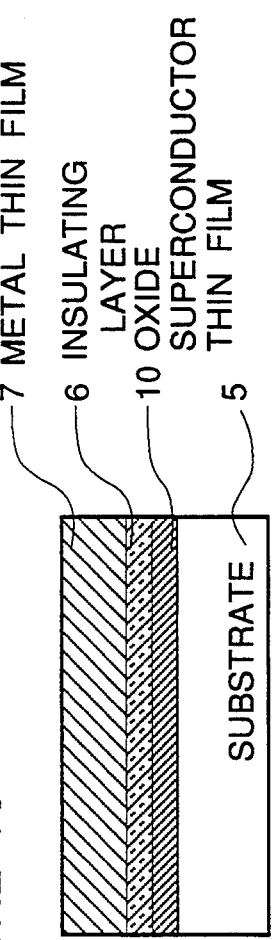
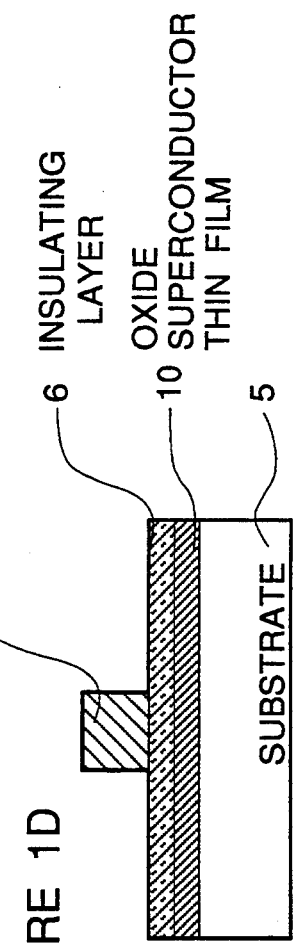
FIGURE 1A
FIGURE 1B
FIGURE 1C
FIGURE 1D

SUPERCONDUCTING DEVICE HAVING A REDUCED THICKNESS OF OXIDE SUPERCONDUCTING LAYER

This application is a continuation of application Ser. No. 07/761,047, filed Sep. 18, 1990, abandoned, which application is entirely incorporated herein by reference.

BACKGROUND OF THE INVENTION

1. Field of the Invention

The present invention relates to a method for manufacturing a superconducting device, and more .specifically to a method for manufacturing a superconducting device including an oxide superconducting layer having a partially reduced thickness portion forming a superconducting channel controlled by a gate electrode, and a superconducting device manufactured by the method.

2. Description of Related Art

Typical three-terminal devices which utilize a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulator layer on the recessed or undercut rear surface of the portion of the semiconductor layer between the superconductor source electrode and the superconductor drain electrode.

A superconducting current flows through the semiconductor layer portion between the superconductor source electrode and the superconductor drain electrode due to a superconducting proximity effect, and is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has been recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the superconducting proximity effect, the superconductor source electrode and the superconductor drain electrode have to be located close to each other at a distance which is a few times the coherence length of the superconductor materials of the superconductor source electrode and the superconductor drain electrode. In particular, since an oxide superconductor has a short coherence length, if the superconductor source electrode and the superconductor drain electrode are formed of the oxide superconductor material, a distance between the superconductor source electrode and the superconductor drain electrode has to be not greater than a few ten nanometers. However, it is very difficult to conduct a fine processing such as a fine pattern etching so as to ensure the very short separation distance. Because of this, in the prior art, it has been impossible to manufacture the super-FET composed of the oxide superconductor material.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this case, however, a thickness of the superconducting channel has to be made on the order of five nanometers.

SUMMARY OF THE INVENTION

Accordingly, it is an object of the present invention to provide a method for manufacturing a superconducting device, which has overcome the above mentioned defects of the conventional ones.

Another object of the present invention is to provide a method for manufacturing an FET type superconducting device including an oxide superconducting layer having an extremely thin portion forming a superconducting channel, with a good repeatability by using existing established processing techniques.

Still another object of the present invention is to provide an FET type superconducting device having a unique structure which have overcome the above mentioned defects of the conventional ones.

The above and other objects of the present invention are achieved in accordance with the present invention by a method for manufacturing a superconducting device, the method comprising the step of preparing a substrate having a principal surface thereof, forming a first oxide superconductor thin film having a very thin thickness on the principal surface of the substrate, forming on a portion of the first oxide superconductor thin film a stacked structure including a gate insulator formed directly on the first oxide superconductor thin film and a gate electrode formed on the gate insulator, and growing a second oxide superconductor thin film on an exposed surface of the first oxide superconductor thin film, using the gate electrode as a mask, so that first and second superconducting regions having a relatively thick thickness are formed at opposite sides of the gate electrode, electrically isolated from the gate electrode, and forming a source electrode and a drain electrode on the first and second oxide superconducting regions, respectively.

According to another aspect of the present invention, there is provided a superconducting device which comprises a substrate having a principal surface, first and second oxide superconducting regions of a relatively thick thickness formed on the principal surface of the substrate separated from each other, and a third oxide superconducting region of an extremely thin thickness formed on the principal surface of the substrate between the first and second oxide superconducting regions to bridge the first and second oxide superconducting regions and to form a superconducting channel between the first and second oxide superconducting regions, a source electrode and a drain electrode provided on the first and second oxide superconducting regions, respectively, so that a superconducting current can flow through the superconducting channel between the source electrode and the drain electrode, a gate electrode formed through a gate insulator on the third oxide superconducting region for controlling the superconducting current flowing through the superconducting channel, and a side insulating region formed to completely cover each of opposite side surfaces of the gate electrode, the first, second and third oxide superconducting regions being formed of the same oxide superconductor thin film, and the gate electrode being surrounded by the oxide superconductor thin film but electrically isolated from the oxide superconductor thin film by the gate insulator and the side insulating region.

In a preferred embodiment, the oxide superconductor thin film is formed of a material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material. In addition, the oxide superconductor thin film is formed of a single c-axis orientated single crystal film.

In addition, the substrate, on which the oxide superconductor thin film is deposited, can be foraged of an insulating substrate, preferably an oxide single crystalline substrate such as MgO, $SrTiO_3$, $CdNdAlO_4$, etc. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer if a silicon substrate is used.

In the superconducting device manufactured in accordance with the present invention, the superconducting current flowing between the source electrode and the second electrode through the superconducting channel formed of the third oxide superconducting region is controlled by a voltage applied to the gate electrode. Namely, the superconducting device constitutes the super-FET. In order to ensure that the superconducting channel can be turned on and off by a voltage applied to the gate electrode, a thickness of the superconducting channel has to be on the order of five nanometers in the direction of an electric field created by the voltage applied to the gate electrode. This extremely thin superconducting channel can be easily realized or formed in accordance with the method of the present invention.

For example, the first oxide superconductor thin film is formed to have the thickness on the order of about 5 nanometers. This extremely thin oxide superconductor thin film can be formed in a conventional process by precisely controlling both of the thin film growth speed and the growth time. For this purpose, a sputtering can be used. However, since the oxide superconductor crystal has a multi-layer structure in which respective constituent elements are stacked in a layered structure, it is possible to stack a desired number of unit cells of oxide superconductor, by using a MBE (molecular beam epitaxy).

The extremely thin oxide superconductor thin film thus formed or deposited is very preferable in thickness to form a superconducting channel, but insufficient in thickness to form a source region and a drain region. Therefore, the superconducting layer in the source region and the drain region must be further thickened. The above mentioned method in accordance with the present invention is very effective in thickening the source region and the drain region while maintaining the thickness of the extremely thin oxide superconductor thin film constituting the superconducting channel.

Namely, a gate electrode is formed on the extremely thin oxide superconductor thin film at a position corresponding to the superconducting channel, and the oxide superconductor thin film is deposited or grown again on the extremely thin oxide superconductor thin film, using the gate electrode as a mask.

In one preferred embodiment, opposite side surfaces of the gate electrode are coated with a side insulator layer, and the second deposition or growth of the oxide superconductor thin film is performed until the gate electrode is completely embedded in the oxide superconductor thin film, and thereafter, the oxide superconductor thin film is planarized until an upper surface of the gate electrode is exposed at the planarized upper surface of the oxide superconductor thin film. In this process, although the gate electrode is embedded in the oxide superconductor thin film, the gate electrode is electrically isolated from the oxide superconductor thin film by the gate insulator and the side insulator layer.

As seen from the above, the method in accordance with the present invention includes no process of etching or patterning the oxide superconductor thin film for forming the superconducting channel. Therefore, the limitation in the fine processing technique required for manufacturing the super-FET can be relaxed.

In the superconducting device in accordance with the present invention, the gate electrode is surrounded by or embedded in the oxide superconductor thin film. However, since the gate electrode is located on the gate insulator, and since the side surfaces of the gate electrode is covered with the side insulating region, the gate electrode is electrically isolated from the oxide superconductor thin film by the gate insulator and the side insulating region. On the other hand, since the gate electrode is surrounded by or embedded in the oxide superconductor thin film, the superconducting device can have a planarized surface. The side insulating region is formed of an air gap in one embodiment, and of an insulator layer in another embodiment.

The above and other objects, features and advantages of the present invention will be apparent from the following description of preferred embodiments of the invention with reference to the accompanying drawings.

BRIEF DESCRIPTION OF THE DRAWINGS

FIGS. 1A to 1G are diagrammatic sectional views for illustrating a first embodiment of the method in accordance with the present invention for manufacturing the superconducting device.

DESCRIPTION OF THE PREFERRED EMBODIMENTS

Figure 1E:
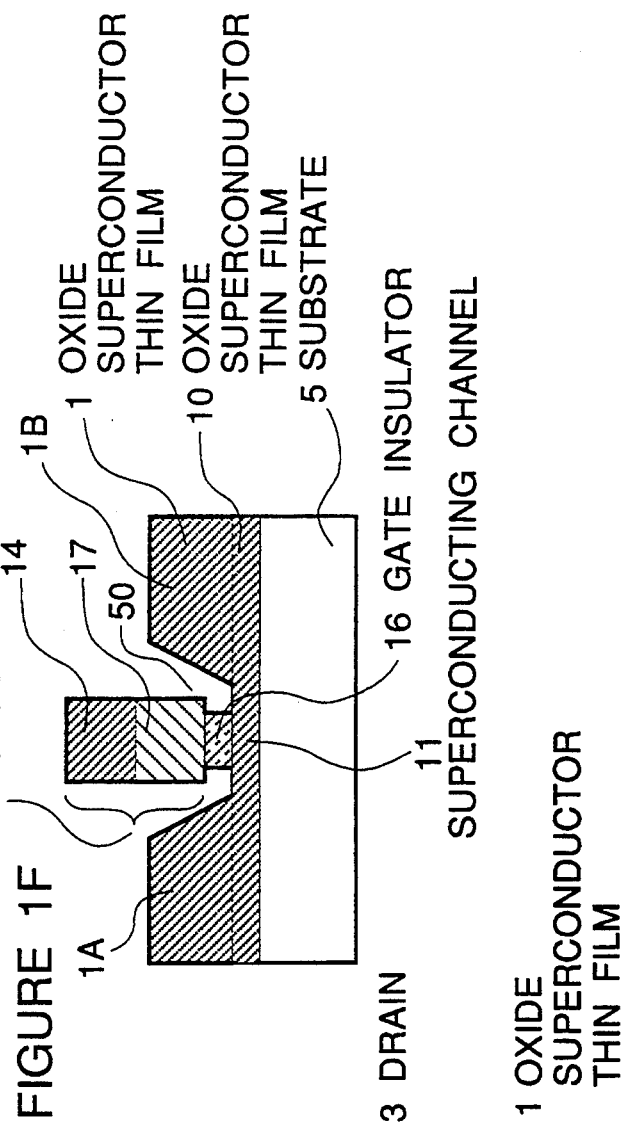

Referring to FIGS. 1A to 1G, the process in accordance with the present invention for manufacturing the super-FET will be described.

As shown in FIG. 1A, a substrate 5 having a substantially planar principal surface is prepared. This substrate 5 is formed of for example, an insulator substrate such as a MgO (100) substrate, a $SrTiO_3$ (100) substrate, a $CdNdAlO_4$ (001) substrate or others, or a semiconductor substrate such as a silicon substrate having a principal surface coated with a buffer layer composed of an insulating film. In the case of the silicon substrate, the principal surface of the silicon substrate is preferably continuously coated with $MgAl_2O_4$ by a CVD (chemical vapor deposition) and also with $BaTiO_3$ by a sputtering process.

As shown in FIG. 1B, an extremely thin oxide superconductor thin film 10 having a thickness on the order of about five nanometers is deposited on the principal surface of the substrate 5, by, for example, an off-axis sputtering, a reactive evaporation, an MBE (molecular beam epitaxy), a CVD, etc. This extremely thin oxide superconductor thin film 10 forms a superconducting channel 11 when the super-FET is completed. The oxide superconductor thin film is preferably formed of, for example, a Y—Ba—Cu—O type compound oxide superconductor material, a Bi—Sr—Ca—CU—O type compound oxide superconductor material, or a Tl—Ba—Ca—Cu—O type compound oxide superconductor material. In addition, a c-axis orientated thin film is preferably deposited, since the c-axis orientated thin film has a large critical current density in the direction in parallel to the substrate surface.

Then, as shown in FIG. 1C, an insulating layer 6 is deposited on the oxide superconductor thin film 10, and a metal layer 7 is deposited on the insulating layer 6. The insulating layer 6 is deposited to have a thickness of not less than ten nanometers which is sufficient to prevent a tunnel current. In addition, the insulating layer 6 is formed of an insulating material such as MgO, which does not form a large density of energy levels between the superconductor thin film 10 and the insulating layer 6. Furthermore, from the viewpoint of a mechanical stress, it is preferred to form on the oxide superconductor thin film 10 an insulating layer having a composition similar or analogous to that of the oxide superconductor thin film 10, without taking out the substrate 5 from a film deposition apparatus or chamber after the oxide superconductor thin film 10 is deposited on the substrate 5.

The metal layer 7 can be deposited by a vacuum evaporation or any other suitable process, so as to have a thickness of about 200 nanometers. The metal layer 7 can be formed of Au, or a refractory metal such as Ti, W or a silicide thereof.

The insulating layer 6 and the metal layer 7 are preferably continuously deposited on the oxide superconductor thin film 10, without taking out the substrate 5 from a film deposition apparatus or chamber.

Thereafter, the stacked layer of the insulating layer 6 and the metal layer 7 is selectively removed so as to form a gate electrode. For this purpose, as shown in FIG. 1D, the metal layer 7 is selectively etched so as to remove all of the metal layer excluding a portion which becomes the gate electrode on the superconducting channel 11, so that the gate metal 17 is formed. Then, as shown in FIG. 1E, the insulating layer 6 is selectively etched in a self alignment to the patterned gate metal 17, so that an gate insulator 16 is left on the oxide superconductor thin film 10 and only under the patterned gate metal 17. In this connection, it is desired that the gate insulator 16 is side-etched in comparison with the gate metal 17, so that the gate insulator 16 has a length shorter than that of the gate metal 17.

Figure 1F:
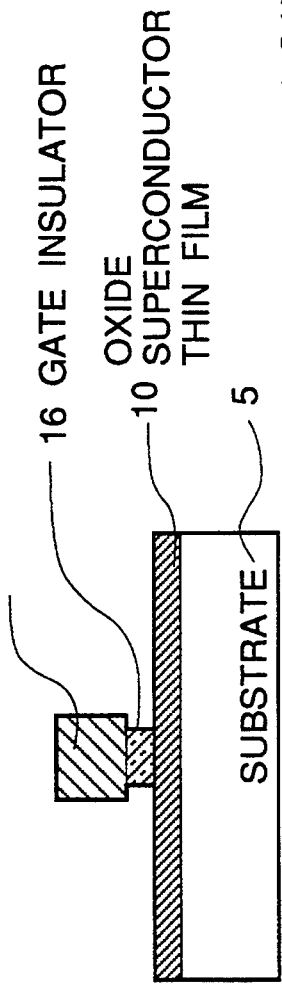

As shown in FIG. 1F, an oxide superconductor thin film 1 is grown again on the substrate 5, namely on the extremely thin oxide superconductor thin film 10, using the stacked structure of the gate metal 17 and the gate insulator 16 as a mask. This process must be done under precise control of a sputtering and a sputter-etching which are alternately and repetitively performed. In this process, a precise gap 50 is obtained between the gate metal 17 and the newly grown oxide superconductor thin film. A gate electrode 4 is formed of the gate metal 17 and an oxide superconductor thin film 14 deposited on the gate metal 17. On the other hand, the oxide superconductor thin film 1 deposited on the exposed oxide superconductor thin film 10 at each side of the gate electrode becomes integral with the oxide superconductor thin film 10, so that a pair of oxide superconductor thin film regions 1A and 1B having a relative thick thickness are formed at opposite sides of the gate electrode 4, but separately from the gate electrode 4.

Figure 1G:
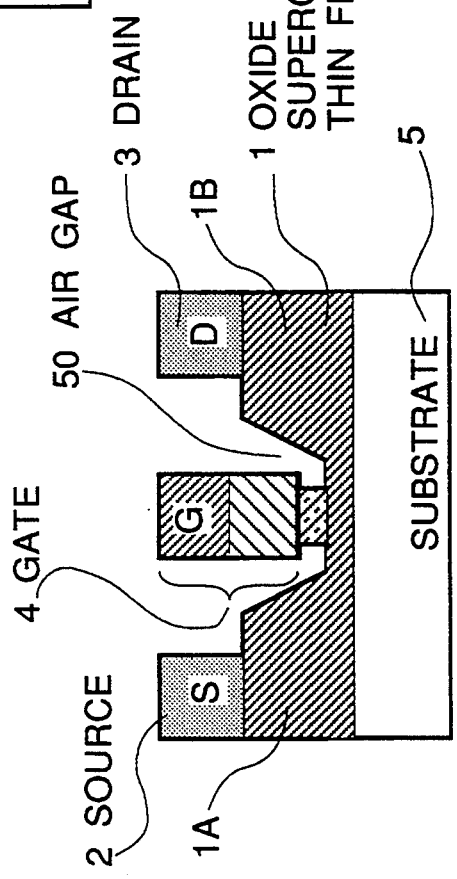

Finally, as shown in FIG. 1G, a source electrode 2 and a drain electrode 3 of a metal such as Au are formed on the oxide superconductor thin film 1 at both sides of the gate electrode 4, respectively. With this, the super-FET in accordance with the present invention is completed.

As explained above, if the super-FET is manufactured in accordance with the first embodiment of the method of the present invention, the limitation in the fine processing technique required for manufacturing the super-FET is relaxed. In addition, it is possible to form other wiring conductors if necessary, at the time of forming the source electrode and the drain electrode. Since the flatness of the upper surface of the superconducting device can be improved, it becomes easy to form conductor wirings in a later process. Accordingly, it is easy to manufacture the super-FET with good repeatability, and the manufactured super-FET has a stable performance.

Referring to FIGS. 2A to 2D, a second embodiment of the process for manufacturing the superconducting device will be described.

Figure 2A:
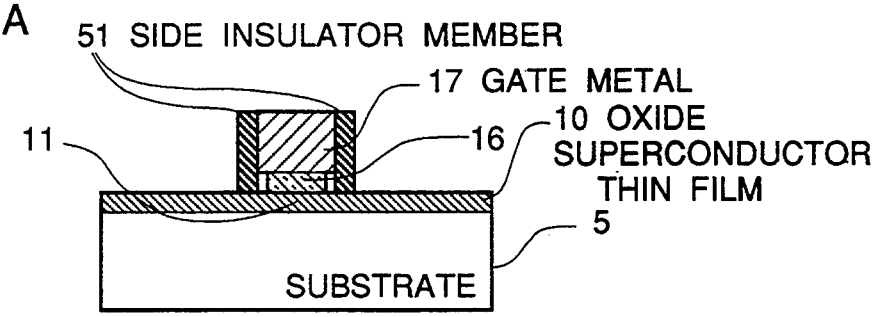
FIGS. 2A to 2D are diagrammatic sectional views for illustrating featured steps of a second embodiment of the method in accordance with the present invention for manufacturing the superconducting device.

In this second embodiment, the same processings as those shown in FIGS. 1A to 1E are performed. After the gate insulator 16 and the gate metal 17 are formed, an insulator member 51 is formed to surround a side surface of the gate metal 17 as shown in FIG. 2A. This insulator member 51 can be formed by depositing an insulator layer covering the gate metal 17 and the oxide superconductor thin film 10, and etching back the deposited insulator layer by means of an anisotropic etching so that the insulator layer remains only on the side surface of the gate metal 17. Alternatively, the insulating member 51 can be formed by oxidizing or nitriding the side surface of the gate metal 17.

Figure 2B:
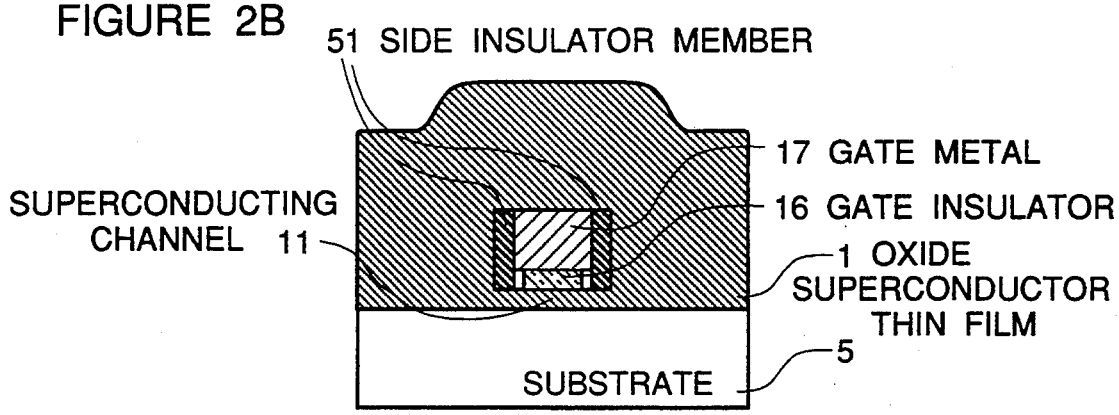

Thereafter, as shown in FIG. 2B, the oxide superconductor thin film is grown again on the substrate 5, namely on the extremely thin oxide superconductor thin film 10, so that the gate metal 17 is completely embedded within the deposited oxide superconductor thin film 1. For example, the oxide superconductor thin film 1 is grown to have a thickness on the order of about 300 nm.

Figure 2C:
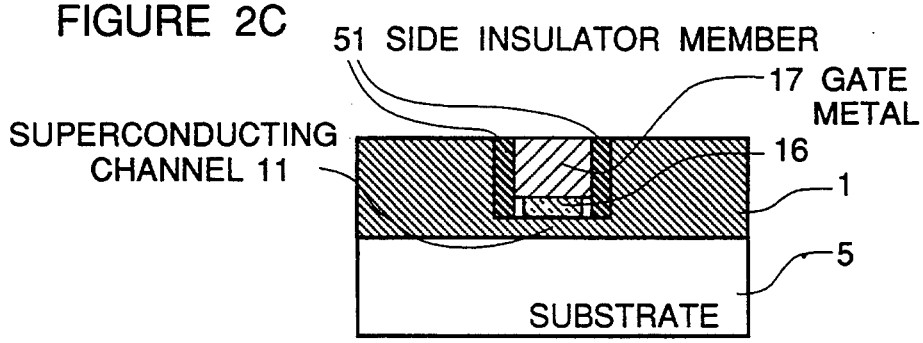

Thereafter, in order to planarize an upper surface of the deposited oxide superconductor thin film 1, a photoresist layer (not shown) is deposited on the oxide superconductor thin film 1 in such a manner that the deposited photoresist layer has a flat upper surface, and then, the deposited photoresist layer and the deposited oxide superconductor thin film 1 are etched back, until the upper surface of the oxide superconductor thin film 1 is planarized and the gate metal 17 is exposed at the planarized upper surface of the oxide superconductor thin film 1 as shown in FIG. 2C.

Figure 2D:
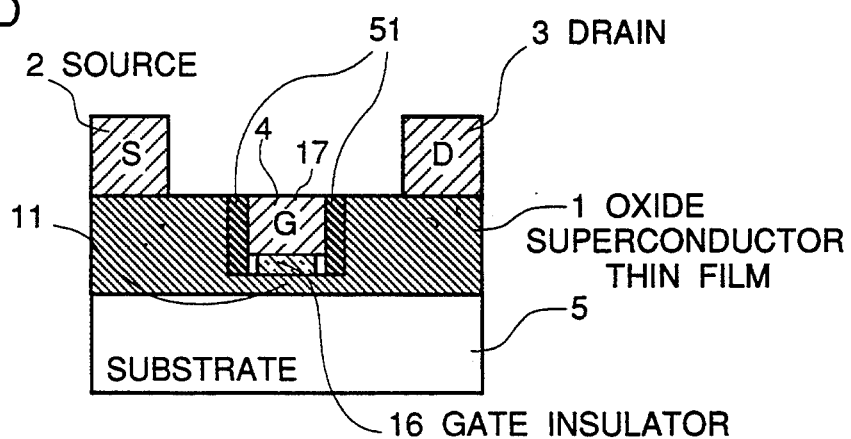

Finally, as shown in FIG. 2D, a source electrode 2 and a drain electrode 3 are formed on the oxide superconductor thin film 1 at both sides of the gate metal 17, respectively. For example, the source electrode 2 and the drain electrode 3 are formed of the same material as that of the gate metal 17 functioning as a gate electrode 4, With this, the super-FET in accordance with the present invention is completed.

As explained above, if the super-FET is manufactured in accordance with the second embodiment of the method of the present invention, the limitation in the fine processing technique required for manufacturing the super-FET is relaxed, similarly to the first embodiment. In addition, since the upper surface of the superconductor thin film is planarized, it become easy to form conductor wirings in a later process. Accordingly, it is easy to manufacture the super-FET with good repeatability, and the manufactured super-FET has a stable performance.

The super-FET manufactured in accordance with the method of the present invention comprises the oxide superconductor thin film 1 formed on the substrate 5 and the gate electrode 4 surrounded by or embedded in the oxide superconductor thin film 1. Underneath the gate electrode 4, the oxide superconductor thin film 1 is as extremely thin as about five nanometers, so as to form the superconducting channel 11. On the other hand, the gate electrode 4 is located on the gate insulator 16 formed directly on the superconducting channel 11, and the side surface of the gate electrode 4 is covered with an insulating region, which is formed of an air gap 50 in the embodiment shown in FIG. 1G or the side insulator member 51 in the embodiment shown in FIG. 2D. Therefore, the gate electrode 4 is completely isolated from the oxide superconductor thin film 1.

The invention has thus been shown and described with reference to the specific embodiments. However, it should be noted that the present invention is in no way limited to the details of the illustrated structures but changes and modifications may be made within the scope of the appended claims.

We claim:

1. A superconducting device comprising a substrate having a principal surface, first and second oxide superconducting regions formed on the principal surface of the substrate and separated from each other, and a third oxide superconducting region of an extremely thin thickness formed on the principal surface of the substrate between the first and second oxide superconducting regions to bridge the first and second oxide superconducting regions and to form a superconducting channel between the first and second oxide superconducting regions, the first and second oxide superconducting regions being thick relative to the thickness of the third oxide superconducting region, a source electrode and a drain electrode provided on the first and second oxide superconducting regions, respectively, so that a superconducting current can flow through the superconducting channel between the source electrode and the drain electrode, a gate electrode formed through a gate insulator on the third oxide superconducting region for controlling superconducting current flow through the superconducting channel, and a side electrically insulating region formed to completely cover each of opposite side surfaces of the gate electrode, the first, second and third oxide superconducting regions being formed of a same c-axis oriented, single crystal oxide superconductor thin film, and the gate electrode being surrounded by the oxide superconductor thin film but electrically isolated from the oxide superconductor thin film by the gate insulator and the side electrically insulating region.

2. A superconducting device claimed in claim 1 wherein the side electrically insulating region contacts all side surfaces of the gate electrode, and contacts all side surfaces of the first and second superconducting regions that are in opposition to all said side surfaces of the gate electrode, whereby the gate electrode is embedded within the oxide superconductor thin film and wherein an upper surface of the gate electrode, an upper surface of the electrically insulating region, and an upper surface of the first and second superconducting regions are coextensively planar with one another.

3. A superconducting device claimed in claim 1 wherein the oxide superconductor thin film is formed of an oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

4. A superconducting device claimed in claim 3 wherein the gate electrode is formed of a refractory metal or a silicide thereof.

5. A superconducting device comprising a substrate having a principal surface, first and second oxide superconducting regions formed on the principal surface of the substrate separated from each other, and a third oxide superconducting region of an extremely thin thickness formed on the principal surface of the substrate between the first and second oxide superconducting regions to bridge the first and second oxide superconducting regions and to form a superconducting channel between the first and second oxide superconducting regions, the first and second oxide superconducting regions being thick relative to the thickness of the third oxide superconductivity region, a source electrode and a drain electrode provided on the first and second oxide superconducting regions, respectively, so that a superconducting current can flow through the superconducting channel between the source electrode and the drain electrode, a gate electrode formed through a gate insulator on the third oxide superconducting region for controlling the superconducting current flowing through the superconducting channel, and a side electrically insulating region formed to completely cover each of opposite side surfaces of the gate electrode, the first, second and third oxide superconducting regions being formed of the same oxide superconducting thin film, and the gate electrode being surrounded by the oxide superconductor thin film but electrically isolated from the oxide superconductor thin film by the gate insulator and the side electrically insulating region, the oxide superconductor thin film being formed of an oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material, the first, second and third oxide superconducting regions being formed of a single c-axis orientated single crystal film, the gate electrode being formed of a material selected from the group consisting of Au, Ti, W, and a silicide thereof.

6. A superconducting device claimed in claim 5 wherein the substrate is formed of a material selected from the group consisting of a MgO (100) substrate, a SrTiO$_3$ (100) substrate and a CdNdAlO$_4$ (001) substrate, and a semiconductor substrate.

7. A superconducting device claim in claim 5 wherein the substrate is formed of a silicon substrate having a principal surface coated with an insulating material layer which is formed of a MgAl$_2$O$_4$ layer and a BaTiO$_3$ layer.

8. A superconducting device claimed in claim 5 wherein the gate insulator is formed of an insulating material which avoids formation of a larger energy level density with the oxide superconductor material of the first, second and third oxide superconducting regions.

9. A superconducting device claimed in claim 5 wherein the third oxide superconducting region has a thickness of substantially 5 nm and the gate insulator is formed of MgO and has a thickness of not less than 10 nanometers.

10. A superconducting device claimed in claim 5 wherein the side electrically insulating region is formed of an electrical insulator material, and the gate electrode is embedded in the oxide superconductor thin film so that the gate electrode is isolated from the first, second and third oxide superconducting regions by the gate insulator and the side insulation region formed of the electrical insulator material.

11. A superconducting device claimed in claim 5 wherein the side electrically insulating region contacts all side surfaces of the gate electrode, and contacts all side surfaces of the first and second superconducting regions that are in opposition to all said side surfaces of the gate electrode, whereby the gate electrode is embedded within the oxide superconductor thin film and wherein an upper surface of the gate electrode, an upper surface of the electrically insulating region, and an upper surface of the first and second superconducting regions are coextensively planar with one another.

12. A superconducting device comprising a substrate having a principal surface, first and second oxide superconducting regions of a relatively thick thickness formed on the principal surface of the substrate separated from each other, and a third oxide superconducting region of an extremely thin thickness formed on the principal surface of the substrate between the first and second oxide superconducting regions to bridge the first and second oxide superconducting regions and to form a superconducting channel between the first and second oxide superconducting regions, the first and second oxide superconducting regions being thick relative to the thickness of the third oxide superconductivity region, a source electrode and a drain electrode provided on the first and second oxide superconducting regions, respectively, so that a superconducting current can flow through the superconducting channel between the source electrode and the drain electrode, a gate electrode formed through a gate insulator on the third oxide superconducting region for controlling the superconducting current flowing through the superconducting channel, and a side electrically insulating region formed to completely cover each of opposite side surfaces of the gate electrode, the first, second and third oxide superconducting regions being formed of the same oxide superconducting thin film, and the gate electrode being surrounded by the oxide superconductor thin film but electrically isolated from the oxide superconductor thin film by the gate insulator and the side electrically insulating region, the oxide superconductor thin film being formed of an oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material, the first, second and third oxide superconducting regions being formed of a single c-axis orientated single crystal film, the substrate being formed of a silicon substrate having a principal surface coated with an insulating material layer which is formed of a MgAl$_2$O$_4$ layer and a BaTiO$_3$.

13. A superconducting device claimed in claim 12 wherein the gate electrode is formed of a refractory metal or a silicide thereof.

14. A superconducting device claimed in claim 12 wherein the gate insulator is formed of an insulating material which avoids formation of a larger energy level density with the oxide superconductor material of the first, second and third oxide superconducting regions.

15. A superconducting device claimed in claim 12 wherein the third oxide superconducting region has a thickness of substantially 5 nm and the gate insulator is formed of MgO and has a thickness of not less than 10 nanometers.

16. A superconducting device claimed in claim 12 wherein the side electrically insulating region is formed of an electrical insulator material, and the gate electrode is embedded in the oxide superconductor thin film so that the gate electrode is isolated from the first, second and third oxide superconducting regions by the gate insulator and the side insulation region formed of the electrical insulator material.

17. A superconducting device claimed in claim 12 wherein the side electrically insulating region contacts all side surfaces of the gate electrode, and contacts all side surfaces of the first and second superconducting regions that are in opposition to all said side surfaces of the gate electrode, whereby the gate electrode is embedded within the oxide superconductor thin film and wherein an upper surface of the gate electrode, an upper surface of the electrically insulating region, and an upper surface of the first and second superconducting regions are coextensively planar with one another.

18. A superconducting device comprising a substrate having a principal surface, first and second oxide superconducting regions of a relatively thick thickness formed on the principal surface of the substrate separated from each other, and a third oxide superconducting region of an extremely thin thickness formed on the principal surface of the substrate between the first and second oxide superconducting regions to bridge the first and second oxide superconducting regions and to form a superconducting channel between the first and second oxide superconducting regions, the first and second oxide superconducting regions being thick relative to the thickness of the third oxide superconductivity region, a source electrode and a drain electrode provided on the first and second oxide superconducting regions, respectively, so that a superconducting current can flow through the superconducting channel between the source electrode and the drain electrode, a gate electrode formed through a gate insulator on the third oxide superconducting region for controlling the superconducting current flowing through the superconducting channel, and a side electrically insulating region formed to completely cover each of opposite side surfaces of the gate electrode, the first, second and third oxide superconducting regions being formed of the same oxide superconducting thin film, and the gate electrode being surrounded by the oxide superconductor thin film but electrically isolated from the oxide superconductor thin film by the gate insulator and the side electrically insulating region, the oxide superconductor thin film being formed of an oxide superconductor material selected from the group consisting of a Y—Ba—Cu—O compound oxide superconductor material, a Bi—Sr—Ca—CU—O compound oxide superconductor material, and a Tl—Ba—Ca—Cu—O compound oxide superconductor material, the first, second and third oxide superconducting regions being formed of a single c-axis orientated single crystal film, the gate insulator being formed of an insulating material which avoids formation of a large energy level density with the oxide superconductor material of the first, second and third oxide superconducting regions.

19. A superconducting device claimed in claim 18 wherein the gate electrode is formed of a refractory metal or a silicide thereof.

20. A superconducting device claimed in claim 18 wherein the substrate is formed of a material selected from the group consisting of a MgO (100) substrate, a SrTiO$_3$ (100) substrate and a CdNdAlO$_4$ (001) substrate, and a semiconductor substrate.

21. A superconducting device claimed in claim 18 wherein the third oxide superconducting region has a thickness of substantially 5 nm and the gate insulator is formed of MgO and has a thickness of not less than 10 nanometers.

22. A superconducting device claimed in claim 18 wherein the side electrical insulating region is formed of an electrical insulator material, and the gate electrode is embedded in the oxide superconductor thin film so that the gate electrode is isolated from the first, second and third oxide superconducting regions by the gate insulator and the side insulation region formed of the electrical insulator material.

23. A superconducting device claimed in claim 18 wherein the side electrically insulating region contacts all side surfaces of the gate-electrode, and contacts all side surfaces of the first and second superconducting regions that are in opposition to all said side surfaces of the gate electrode, whereby the gate electrode is embedded within the oxide superconductor thin film and wherein an upper surface of the gate electrode, an upper surface of the electrically insulating region, and an upper surface of the first and second superconducting regions are coextensively planar with one another.

24. A superconducting device comprising a substrate having a principal surface, first and second oxide superconducting regions formed on the principal surface of the substrate separated from each other, and a third oxide superconducting region of an extremely thin thickness formed on the principal surface of the substrate between the first and second oxide superconducting regions to bridge the first and second oxide superconducting regions and to form a superconducting channel between the first and second oxide superconducting regions, the first and second oxide superconducting regions being thick relative to the thickness of the third oxide superconductivity region, a source electrode and a drain electrode provided on the first and second oxide superconducting regions, respectively, so that a superconducting current can flow through the superconducting channel between the source electrode and the drain electrode, a gate electrode formed through a gate insulator on the third oxide superconducting region for controlling the superconducting current flowing through the superconducting channel, and a side electrically insulating region formed to completely cover each of opposite side surfaces of the gate electrode, the first, second and third oxide superconducting regions being formed of the same oxide superconducting thin film, and the gate electrode being surrounded by the oxide superconductor thin film but electrically isolated from the oxide superconductor thin film by the gate insulator and the side electrically insulating region, the oxide superconductor thin film being formed of an oxide superconductor material selected from the group consisting of a Y—Ba—Cu—O compound oxide superconductor material, a Bi—Sr—Ca—CU—O compound oxide superconductor material, and a Tl—Ba—Ca—Cu—O compound oxide superconductor material, the first, second and third oxide superconducting regions being formed of a single c-axis orientated single crystal film, the third oxide superconducting region having a thickness of substantially 5 nm and the gate insulator being formed of MgO and having a thickness of not less than 10 nanometers.

25. A superconducting device claimed in claim 24 wherein the gate electrode is formed of a refractory metal or a silicide thereof.

26. A superconducting device claimed in claim 24 wherein the substrate is formed of a material selected from the group consisting of a MgO (100) substrate, a SrTiO$_3$ (100) substrate and a CdNdAlO$_4$ (001) substrate, and a semiconductor substrate.

27. A superconducting device claimed in claim 24 wherein the side electrical insulating region is formed of an electrical insulator material, and the gate electrode is embedded in the oxide superconductor thin film so that the gate electrode is isolated from the first, second and third oxide superconducting regions by the gate insulator and the side insulation region formed of the electrical insulator material.

28. A superconducting device claimed in claim 24 wherein the side electrically insulating region contacts all side surfaces of the gate electrode, and contacts all side surfaces of the first and second superconducting regions that are in opposition to all said side surfaces of the gate electrode, whereby the gate electrode is embedded within the oxide superconductor thin film and wherein an upper surface of the gate electrode, an upper surface of the electrically insulating region, and an upper surface of the first and second superconducting regions are coextensively planar with one another.

* * * * *